(12) United States Patent
Fichet et al.

(10) Patent No.: US 10,971,550 B2
(45) Date of Patent: Apr. 6, 2021

(54) PHOTODIODE ARRAYS

(71) Applicant: Flexenable Limited, Cambridge (GB)

(72) Inventors: Guillaume Fichet, Cambridge (GB); Elizabeth Speechley, Cambridge (GB)

(73) Assignee: Flexenable Limited, Cambridge (GB)

( * ) Notice: Subject to any disclaimer, the term of this patent is extended or adjusted under 35 U.S.C. 154(b) by 0 days.

(21) Appl. No.: 16/718,721

(22) Filed: Dec. 18, 2019

(65) Prior Publication Data

US 2020/0203433 A1    Jun. 25, 2020

(30) Foreign Application Priority Data

Dec. 21, 2018 (GB) ...................................... 1820987

(51) Int. Cl.
| | |
|---|---|
| H01L 27/30 | (2006.01) |
| H01L 51/42 | (2006.01) |
| H01L 51/44 | (2006.01) |
| H01L 51/00 | (2006.01) |

(52) U.S. Cl.
CPC .......... *H01L 27/307* (2013.01); *H01L 51/428* (2013.01); *H01L 51/441* (2013.01); *H01L 51/0003* (2013.01); *H01L 51/0021* (2013.01); *H01L 51/0035* (2013.01); *H01L 51/0037* (2013.01); *H01L 51/442* (2013.01)

(58) Field of Classification Search
CPC combination set(s) only.
See application file for complete search history.

(56) References Cited

U.S. PATENT DOCUMENTS

| | | | |
|---|---|---|---|
| 2010/0134735 A1 | 6/2010 | Nakamura et al. | |
| 2013/0140548 A1* | 6/2013 | Kohiro | H01L 51/0074 257/40 |
| 2017/0345872 A1 | 11/2017 | Berthod et al. | |
| 2017/0373111 A1* | 12/2017 | Tomyo | G01T 1/241 |
| 2020/0119108 A1* | 4/2020 | Park | G06F 3/0412 |

OTHER PUBLICATIONS

Search Report from United Kingdom Patent Application No. 1820987.4, dated May 31, 2019.

* cited by examiner

*Primary Examiner* — Ratisha Mehta
(74) *Attorney, Agent, or Firm* — Dergosits & Noah LLP; Todd A. Noah

(57) ABSTRACT

A technique comprising: forming on a support film a first stack of layers defining an array of photodiodes; forming over the first stack of layers in situ on the support film a second stack of layers defining electrical circuitry by which the photoresponse of each photodiode is independently detectable via an array of conductors outside the array of photodiodes; wherein forming the first stack of layers comprises depositing an organic semiconductor material over a first electrode, and depositing a second electrode over the organic semiconductor material, wherein the electrical circuitry comprises transistors including photosensitive semiconductor channels, and the second electrode also functions to substantially block the incidence of light on the photosensitive semiconductor channels from the direction of the support film.

5 Claims, 4 Drawing Sheets

PHOTODIODE ARRAYS

CLAIM OF PRIORITY

This application claims priority to United Kingdom Patent Application No. GB 1820987.4, filed on Dec. 21, 2018, the entire contents of which are incorporated herein by reference.

BACKGROUND

Electronic devices comprising photodiode arrays have applications in e.g. fingerprint detectors, vein pattern detectors, image sensors, x-ray detectors etc.

The inventors for the present invention have conducted research into developing photodiode arrays including organic semiconductor material for the active elements of the photodiodes.

The present invention provides a method comprising: forming on a support film a first stack of layers defining an array of photodiodes; forming over the first stack of layers in situ on the support film a second stack of layers defining electrical circuitry by which the photoresponse of each photodiode is independently detectable via an array of conductors outside the array of photodiodes; wherein forming the first stack of layers comprises depositing an organic semiconductor material over a first electrode, and depositing a second electrode over the organic semiconductor material, wherein the electrical circuitry comprises transistors including photosensitive semiconductor channels, and the second electrode also functions to substantially block the incidence of light on the photosensitive semiconductor channels from the direction of the support film.

According to one embodiment, depositing the second electrode comprises depositing organic conductor material over the organic semiconductor material, and depositing reflective conductor material over the organic conductor material.

According to one embodiment, the method further comprises: depositing a continuous layer of the organic conductor material over the organic semiconductor material, depositing a continuous layer of the reflective conductor material over the continuous layer of the organic conductor material, and patterning the continuous layers of organic conductor material and reflective conductor material to define one or more pixel electrodes.

According to one embodiment, edges of organic conductor material pattern substantially align with edges of the reflective conductor pattern in the region of each pixel electrode.

According to one embodiment, the method further comprises: first patterning the continuous layer of reflective conductor material, and thereafter using the patterned layer of reflective conductor material as a mask to pattern the continuous layer of organic conductor material.

There is also hereby provided an electronics device, comprising: a support film; a first stack of layers defining an array of photodiodes comprising an organic semiconductor material; and a second stack of layers defining electrical circuitry by which the photoresponse of each photodiode is independently detectable via an array of conductors outside the array of photodiodes; wherein the electrical circuitry comprises transistors including photosensitive semiconductor channels; and wherein the first stack of layers includes, between the organic semiconductor material and the second stack of layers, an electrode that also functions to substantially block the incidence of light on the photosensitive semiconductor channels from the direction of the support film.

According to one embodiment, the second electrode comprises a layer of organic conductor material over the organic semiconductor material, and a layer of reflective conductor material over the organic conductor material.

According to one embodiment, the layers of organic conductor material and reflective conductor material are patterned layers together defining one or more pixel electrodes.

According to one embodiment, edges of the organic conductor pattern substantially align with edges of the reflective conductor pattern in the region of each pixel electrode.

There is also hereby provided a method comprising: forming on a support film a first stack of layers defining an array of photodiodes; forming over the first stack of layers in situ on the support film a second stack of layers defining electrical circuitry by which the photoresponse of each photodiode is independently detectable via an array of conductors outside the array of photodiodes; wherein forming the first stack of layers comprises coating an organic semiconductor material with a cathode material comprising at least one ionomer, without any plasma pre-treatment of the organic semiconductor material.

According to one embodiment, the electrical circuitry comprises transistors including photosensitive semiconductor channels, and wherein the method comprises coating the cathode material with a reflective conductor material, wherein the cathode material and the reflective conductor material together substantially block the incidence of light on the photosensitive semiconductor channels from the direction of the support film.

According to one embodiment, the cathode material comprises PEDOT:PSS.

According to one embodiment, the reflective conductor material comprises an inorganic metal.

BRIEF DESCRIPTION OF THE FIGURES

Embodiments of the invention are described in detail hereunder, by way of example only, with reference to the accompanying drawings, in which.

DETAILED DESCRIPTION

Figure 1A:
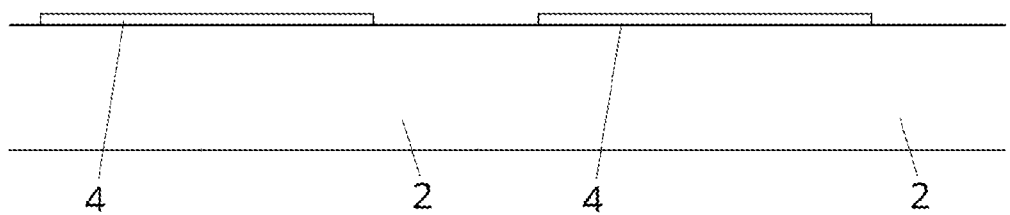
FIGS. 1A-1H show a technique according to an example embodiment of the present invention.
Figure 1B:
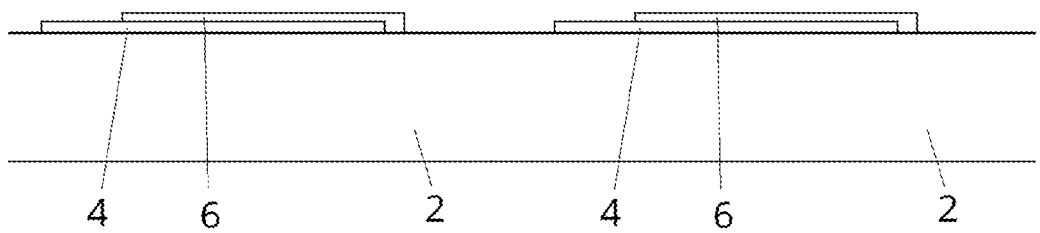
Figure 1C:
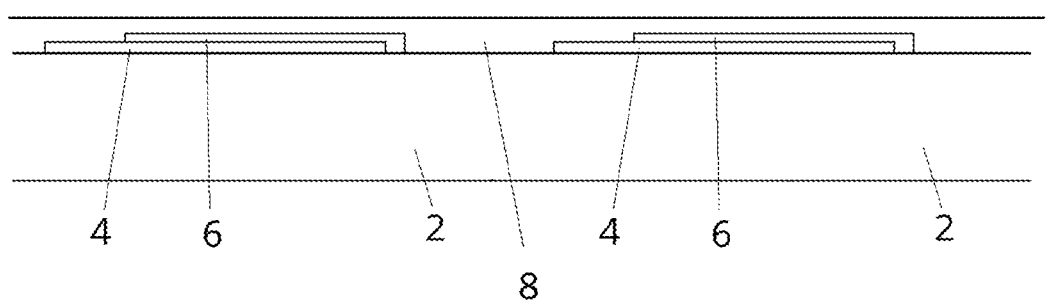
Figure 1D:
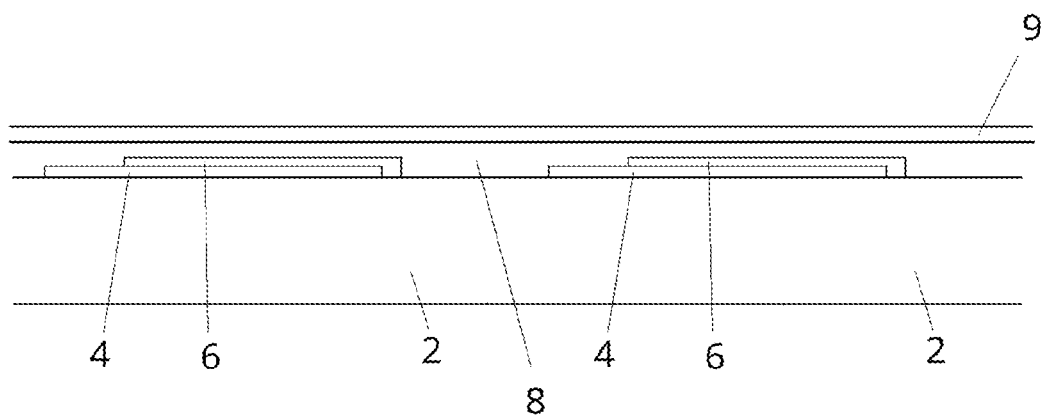
Figure 1E:
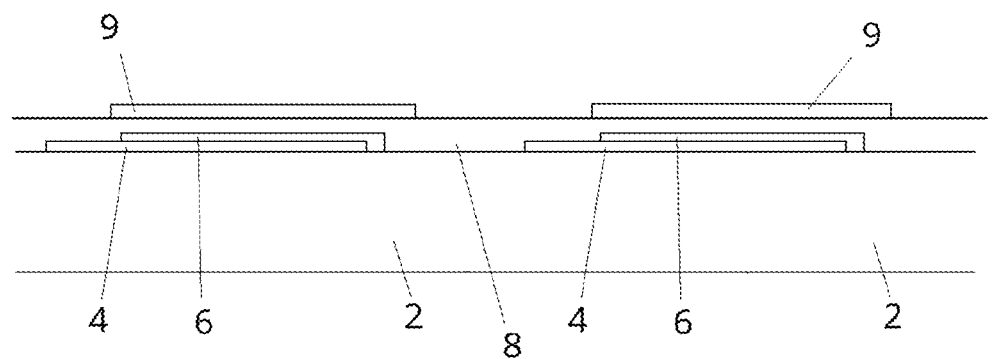
Figure 1F:
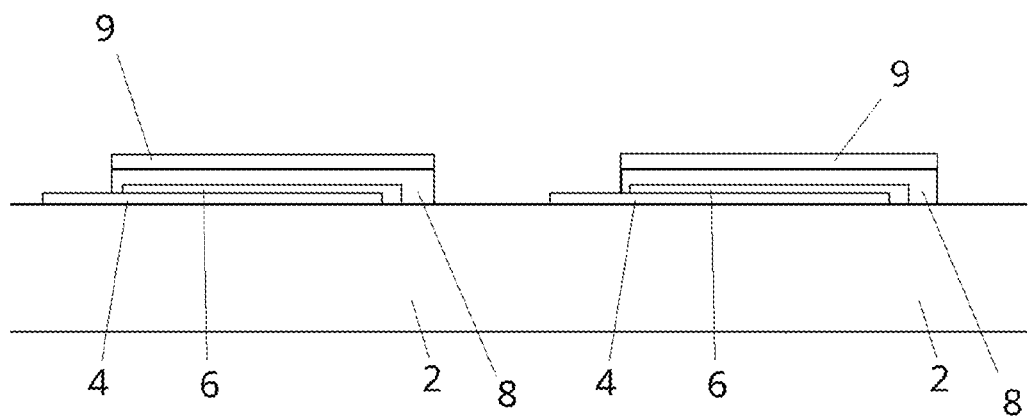
Figure 1G:
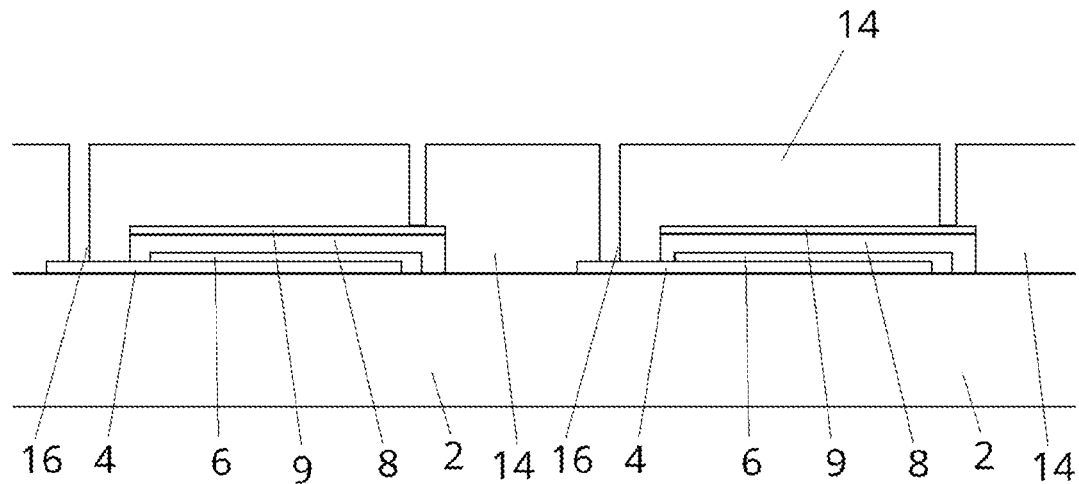
Figure 1H:
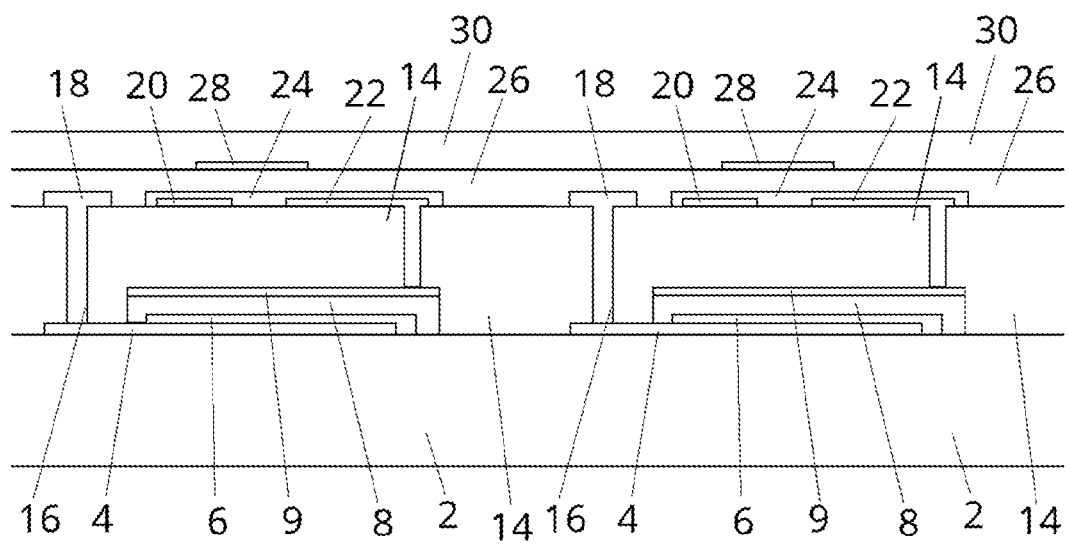

In one example embodiment, the electrical circuitry associated with the photodiode array comprises organic transistor devices (such as an organic thin film transistor (OTFT) devices). OTFTs comprise an organic semiconductor (such as e.g. an organic polymer or small-molecule semiconductor) for the semiconductor channels.

For simplicity, the accompanying drawings only show two photodiodes, but a photodiode array may comprise a large number of photodiodes and electrical circuitry for independently detecting the photoresponse of each of the large number of photodiodes via conductors outside the array of photodiodes. These conductors outside the array of photodiodes may, for example, be routed to processing circuitry/chips located outside the array of photodiodes or located behind the array of photodiodes.

With reference to FIGS. 1A-1H, a transparent conductor material such as a metal oxide conductor (e.g. indium tin oxide ITO) is deposited by a vapour deposition technique such as sputtering on a transparent support component 2 comprising e.g. a transparent plastics support film. A transparent plastics support film may form the main structural element of the resulting device, and may have coatings on one or both surfaces before depositing the transparent conductor material. The layer of transparent conductor material is then patterned, by e.g. etching through a photoresist mask to define an array of lower pixel electrodes 4.

A film of a solution of organic semiconductor material (such as an organic semiconductor polymer) having a bandgap in the electromagnetic frequency region of interest (e.g. visible region and/or infra-red region) is deposited by a liquid processing technique such as e.g. spin coating, ink-jet printing, bar coating over the transparent conductor pattern 4, and dried to remove solvent. This organic semiconductor is hereafter referred to as a photosensitive semiconductor, in view of its key function of generating charge carrier pairs in response to exposure to electromagnetic radiation in the frequency region of interest. The resulting photosensitive organic semiconductor layer is also patterned to define an array of photosensitive organic semiconductor islands 6 (e.g. by a photolithographic technique using a photoresist mask), each semiconductor island in contact with a respective lower pixel anode 4, but leaving a portion of the respective lower pixel anode 4 exposed for the later formation of a conductive interlayer connect down to the lower pixel anode 4.

For example, the deposition of the photosensitive organic semiconductor may be preceded by the deposition of another organic semiconductor that does not necessarily have a bandgap in the electromagnetic frequency region of interest, but functions to facilitate the movement of charge carriers generated in the photosensitive organic semiconductor to the anode 4; and/or the deposition of the photosensitive organic semiconductor may be followed by the deposition of another organic semiconductor that does not necessarily have a bandgap in the electromagnetic frequency region of interest, but functions to facilitate the movement of charge carriers generated in the photosensitive organic semiconductor to the cathode 8, 9. Such a stack of two, three or more organic semiconductor layers may be patterned in a single step to define an array of organic semiconductor islands. Again, each semiconductor island is in contact with a respective lower pixel anode 4, but leaves a portion of the respective lower pixel anode 4 exposed for the later formation of a conductive interlayer connect down to the lower pixel anode 4.

Without conducting any plasma pre-treatment of the upper surface of the organic semiconductor pattern (comprising an organic semiconductor layer or stack of organic semiconductor layers) 6, a continuous film 8 of a solution of one or more ionomers, such as a mixture of poly(3,4-ethylenedioxythiophene) (PEDOT) and polystyrene sulfonate (PSS), is then deposited by a liquid processing technique such as e.g. spin-coating over the semiconductor pattern 6, and dried to remove solvent. Next, a continuous layer 9 of a reflective conductor material, such as a layer of a reflective inorganic metal, such as e.g. silver, gold, molybdenum, aluminium or tantalum, is deposited by a vapour deposition technique, such as e.g. sputtering, on the ionomer layer 8. The continuous reflective conductor layer 9 is then patterned by a photolithographic technique to produce a patterned reflective conductor layer 9. For example, the photolithographic technique may comprise depositing a photoresist material (not shown) over the continuous reflective conductor layer 9, irradiating selected portions of the photoresist to produce a latent solubility pattern in the photoresist layer, developing the latent solubility pattern to produce a patterned photoresist layer, and then using the patterned photoresist layer as a mask to pattern the underlying continuous reflective conductor layer 9 by e.g. dipping the workpiece in an acid solution that reactively removes the portions of the reflective conductor layer 9 exposed through the patterned photoresist. The resulting patterned layer of reflective conductor material is then itself used as a mask to pattern the underlying continuous ionomer layer 8 (by e.g. reactive ion etching (RIE)), and create an array of pixel electrodes, each pixel electrode comprising ionomer 8 over the organic semiconductor 6 and reflective conductor material 9 over the ionomer 8. This technique results in substantial alignment of the patterns in the reflective conductor and ionomer layers.

Each pixel cathode 8, 9 of the resulting array of pixel cathodes is in contact with a respective semiconductor island 6, and does not make any direct contact with the respective pixel anode 4. Plasma pre-treatment of the organic semiconductor surface can be useful to facilitate intimate coating of an organic semiconductor surface with one or more ionomers (such as PEDOT:PSS mixture)), but the inventors for the present application have found that plasma treatment can damage organic semiconductors and reduce their performance, and this embodiment instead involves coating the untreated organic semiconductor surface with an increased thickness of ionomer 8 to compensate for the absence of the plasma pre-treatment. In this embodiment, the increased thickness of ionomer is advantageously exploited by locating the ionomer 8 between the photoactive semiconductor 6 and the electrical circuitry, which as discussed below comprises OTFTs comprising photosensitive semiconductor channels. In this location, the increased optical absorption of the ionomer layer 8 resulting from the increased thickness of ionomer 8 does not reduce the incidence of light on the photoactive semiconductor 6. Furthermore, the increased optical absorption of the thick ionomer layer 8 also advantageously functions to reduce the incidence of light on the photosensitive semiconductor channels from the direction of the plastics support film 2. This shielding by the thick ionomer layer 8 is supplemented by the reflective conductor layer 9 used to pattern the ionomer layer 8. The thick ionomer layer 8 and the overlying reflective conductor layer 9 together function to substantially block the incidence of light on the photosensitive semiconductor channels from the direction of the plastics support film 2.

The formation of the patterned cathode layer 8 is followed by the deposition of one more organic electrically insulating layers 14. These one or more insulating layers 14 are then patterned to define through holes (vias) 16 extending down to each pixel anode 4 and each pixel cathode 8, 9.

A conductor material is next deposited, by e.g. vapour deposition of a noble metal, to form a conductor layer extending over the insulator pattern 14. The conductor layer is patterned to form a source-drain conductor pattern 20, 22 for a OTFT array, and an array of common conductor lines (COM lines) 18. The source-drain conductor pattern 20, 22 defines at least (i) an array of source conductors 20, each source conductor extending to a region outside the array of photodiodes and providing the source electrodes for a respective row of OTFTs each associated with a respective photodiode, and (ii) an array of drain conductors 22 each providing the drain electrode for a respective OTFT and in contact with the cathode 8,9 of the respective photodiode via a respective through hole 16. Each COM line 18 is connected via through holes 16 to the pixel anodes 4 of a respective row of photodiodes, and also extends to a region outside the array of photodiodes.

An organic semiconductor material 24 is deposited over the conductor pattern 18, 20, 22, and patterned to form an array of semiconductor islands 24, each providing the semiconductor channel for a respective OTFT. A gate dielectric layer or stack of gate dielectric layers 26 is formed over the semiconductor pattern to form the gate dielectric for each OTFT.

A conductor material is deposited, by e.g. vapour deposition of a noble metal, over the gate dielectric layer(s) 26, and patterned to form an array of gate conductors 28. Each gate conductor 28 provides the gate electrodes for a respective column of OTFTs, whereby each OTFT is associated with a respective unique combination of gate and source conductors, making it possible to independently detect the photoresponse of each photodiode in the array.

Further layers may be added over the gate conductor pattern 28, such as a top encapsulation layer 30 to protect the OTFT array and photodiode array against the ingress of potentially degrading species such as oxygen and moisture.

Figure 2:
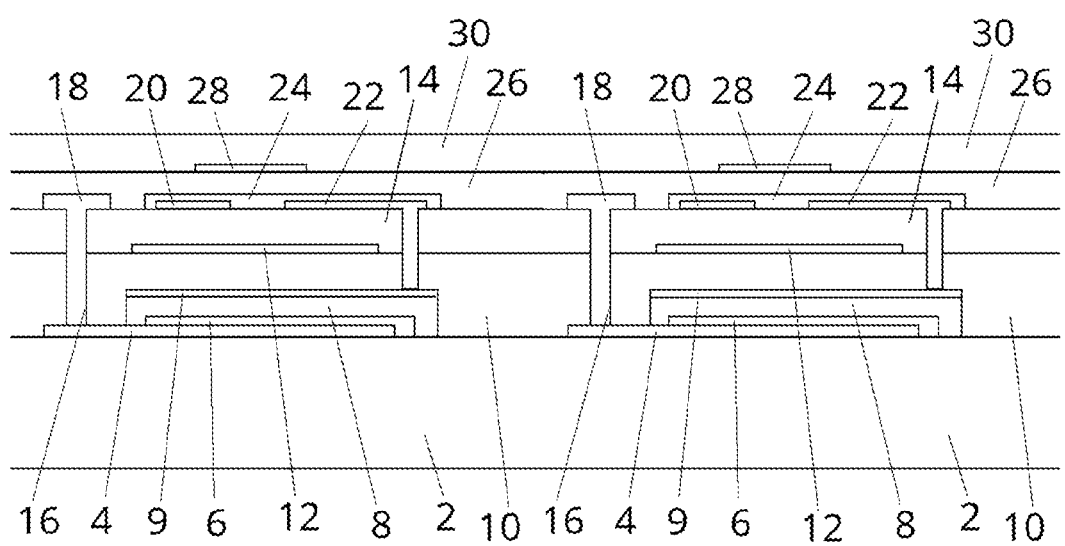
FIG. 2 shows a variation of the technique of FIGS. 1A-1H.

As mentioned above, the thick ionomer layer 8 and the reflective conductor layer 9 used to pattern the ionomer layer 8 are exploited in this embodiment to shield the photosensitive semiconductor channels of the OTFT array against the incidence of light from the direction of the support component 2 (which light could affect the current-voltage (I-V) characteristics of the OTFTs, making the detector output less reliable), and the embodiment of FIG. 1 is characterised by the absence of any light-shielding layer (e.g. metal layer) between the pixel electrodes 8, 9 and the semiconductor channels of the OTFTs. FIG. 2 shows one variation of the technique shown in FIGS. 1A-1H, in which an extra light-shielding layer 12 is incorporated into the device architecture. The insulating layer 14 of FIG. 1 is provided as a stack of insulating layers 10, 14 in FIG. 2, and the deposition of the second insulating layer 14 is preceded by the deposition of a conductor material (by e.g. vapour deposition of a noble metal) to form a conductor layer which is then patterned to define an array of conductor lines, each located in the region of the semiconductor channels of a respective row of OTFTs.

Another variation (not shown) involves replacing the COM lines 18 with a conductor plane over the gate conductor pattern 28 via an extra insulating layer, which conductor plane is in contact with all the pixel anodes 4 via the through holes 16 and further through holes in the extra insulating layer.

In addition to any modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

What is claimed is:

1. A method comprising:
    forming on a support film a first stack of layers defining an array of photodiodes, wherein forming the first stack of layers comprises: i) depositing an organic semiconductor material over a first electrode, and ii) forming pixel electrodes over the organic semiconductor material, wherein forming the pixel electrodes comprises (a) depositing a continuous layer of organic conductor material over the organic semiconductor material, (b) depositing a continuous layer of reflective conductor material over the continuous layer of organic conductor material, (c) patterning the continuous layer of reflective conductor material to produce a reflective conductor material pattern, and (d) thereafter patterning the continuous layer of organic conductor material using the reflective conductor material pattern as a mask to produce an organic conductor material pattern having edges substantially aligned with edges of the reflective conductor pattern in the region of each pixel electrode; and
    forming over the first stack of layers in situ on the support film a second stack of layers defining electrical circuitry by which the photoresponse of each photodiode is independently detectable via an array of conductors outside the array of photodiodes, wherein the electrical circuitry comprises transistors including photosensitive semiconductor channels, and the pixel electrodes also function to substantially block the incidence of light on the photosensitive semiconductor channels from the direction of the support film.

2. A method comprising:
    forming on a support film a first stack of layers defining an array of photodiodes;
    forming over the first stack of layers in situ on the support film a second stack of layers defining electrical circuitry by which the photoresponse of each photodiode is independently detectable via an array of conductors outside the array of photodiodes;
    wherein forming the first stack of layers comprises coating an organic semiconductor material with a cathode material comprising at least one ionomer, without any plasma pre-treatment of the organic semiconductor material.

3. The method according to claim 2, wherein the electrical circuitry comprises transistors including photosensitive semiconductor channels;
    wherein the method comprises coating the cathode material with a reflective conductor material; and
    wherein the cathode material and the reflective conductor material together substantially block the incidence of light on the photosensitive semiconductor channels from the direction of the support film.

4. The method according to claim 2, wherein the cathode material comprises PEDOT:PSS.

5. The method according to claim 3, wherein the reflective conductor material comprises an inorganic metal.

* * * * *